US012783408B1

(12) United States Patent

Zhou et al.

(10) Patent No.: US 12,783,408 B1

(45) Date of Patent: Nov. 3, 2026

(54) CLONING BASED ON BLOCK STRIPE VERSIONING

(71) Applicant: Micron Technology, Inc., Boise, ID (US)

(72) Inventors: Donghua Zhou, Shanghai (CN); Meng Wei, Shanghai (CN); Siqi Xie, Shanghai (CN)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 19/219,323

(22) Filed: May 27, 2025

(51) Int. Cl.
*G06F 12/02* (2006.01)
*G11C 29/10* (2006.01)

(52) U.S. Cl.
CPC .......... *G06F 12/0246* (2013.01); *G11C 29/10* (2013.01); *G06F 2212/7201* (2013.01)

(58) Field of Classification Search
CPC ......... G06F 12/0246; G06F 2212/7201; G11C 29/10
See application file for complete search history.

(56) References Cited

U.S. PATENT DOCUMENTS 6,594,743 B1 * 7/2003 Chen ..................... G06F 3/0601 369/84
2004/0128457 A1 * 7/2004 Maki ..................... G06F 3/0607 711/114
2017/0255392 A1 * 9/2017 Nakashima ........... G06F 3/0673

* cited by examiner

*Primary Examiner* — Mark A Giardino, Jr.

(74) *Attorney, Agent, or Firm* — Schwegman Lundberg & Woessner, P.A.

(57) ABSTRACT

Various example embodiments provide cloning a source memory system to a destination memory system based on block stripe versioning, which can be used to determine translation unit write sequences. In particular, various example embodiments enable a host system to use block stripe version numbers and data that describes a write sequence of TUs within individual block stripes to rapidly replicate one or more specific operational states of a source memory system (e.g., a source SSD) to a destination memory system (e.g., a destination SSD), which can enable or facilitate testing or performance evaluation of the destination memory system.

20 Claims, 8 Drawing Sheets

CLONING BASED ON BLOCK STRIPE VERSIONING

TECHNICAL FIELD

Example embodiments of the disclosure relate generally to memory devices and, more specifically, to cloning a source memory system (e.g., a source memory sub-system) to a destination memory system (e.g., destination memory sub-system) based on block stripe versioning, which can be used to determine translation unit write sequences.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various example embodiments of the disclosure. The drawings, however, should not be taken to limit the disclosure to the specific example embodiments, but are for explanation and understanding only.

DETAILED DESCRIPTION

Figure 1:
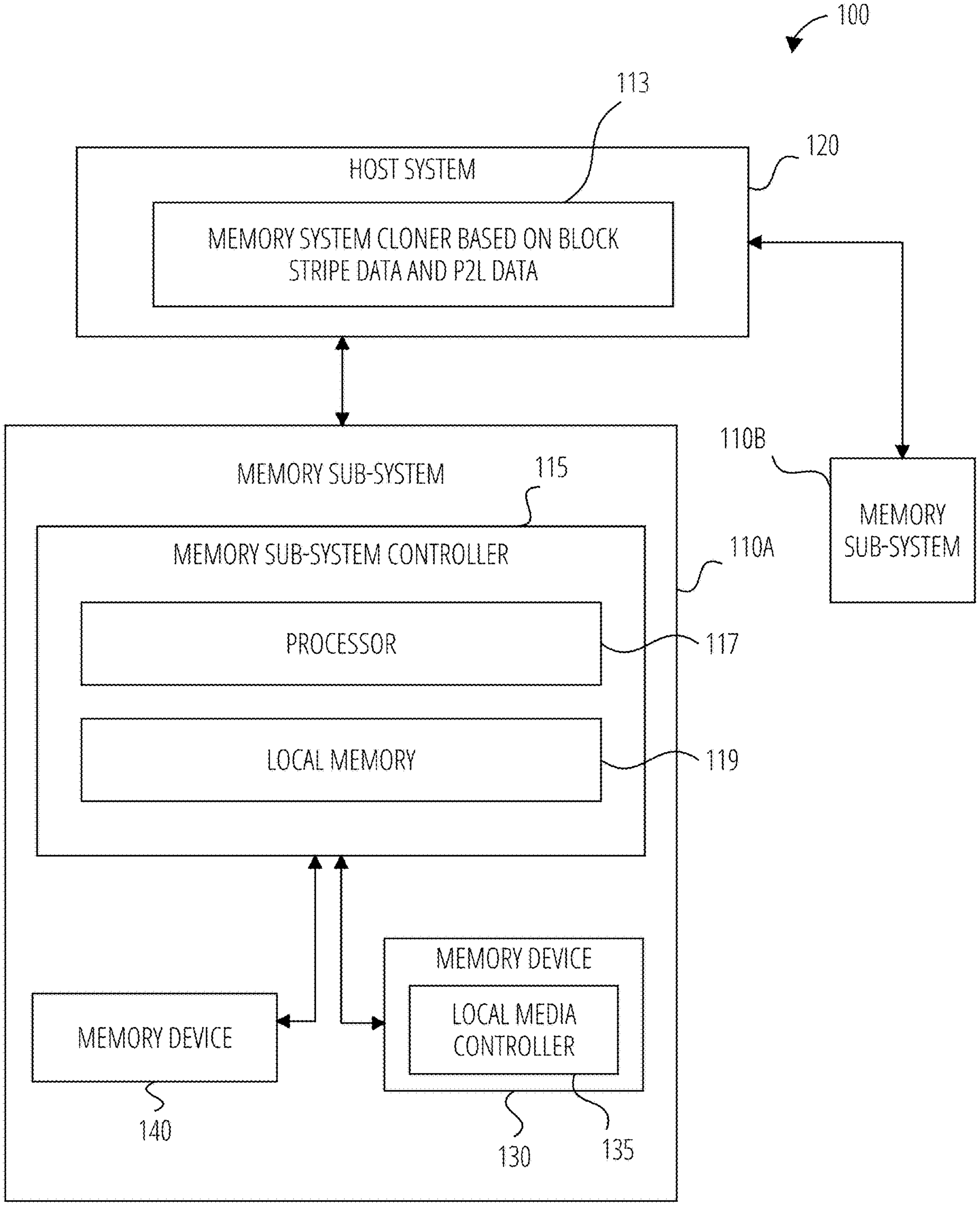
FIG. 1 is a block diagram illustrating an example computing system that includes a memory sub-system, in accordance with some example embodiments of the present disclosure.

Aspects of the present disclosure are directed to cloning a source memory system (e.g., a source memory sub-system) to a destination memory system (e.g., destination memory sub-system) based on block stripe versioning, which can be used to determine translation unit write sequences. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write command, read command) to the memory sub-system, such as to store data on a memory device at the memory sub-system, read data from the memory device on the memory sub-system, or write/read constructs (e.g., such as submission and completion queues) with respect to a memory device on the memory sub-system. The data to be read or written, as specified by a host request, is hereinafter referred to as "host data" or "user data."

A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error-correcting code (ECC) code word, parity code), data version (e.g., used to distinguish age of data written), valid bitmap (which LBAs or logical transfer units contain valid data), and so forth.

As used herein, a logical memory address can comprise a logical block address (LBA), which can be provided by a host system to a memory device or a memory sub-system. For example, depending on a physical interface used between a host system and a memory device/memory sub-system, an LBA can comprise a 2-byte or 4-byte number. As used herein, a physical memory address can comprise a memory address on a memory device or a memory sub-system where data (e.g., user data) is stored. For example, the physical memory address can comprise a physical block address (PBA), which can be a position within an underlying non-volatile memory device that can be identified by a 4-byte number or a tuple of numbers (e.g., die ID, block ID, page ID). As used herein, address mapping data can comprise logical memory address-to-physical memory address (L2P) data (e.g., L2P mapping or translation table), which can associate (and therefore facilitate translation or reconstruction of) a logical memory address to a physical memory address of a memory device or a memory sub-system. Additionally, physical memory address-to-logical memory address (P2L) data can be saved on a memory sub-system as backup data that can be used to rebuild a L2P mapping/L2P data (e.g., if L2P data is lost or becomes unavailable in local memory of the memory system controller) and can be used to quickly find valid data during garbage collection.

The memory sub-system can initiate media management operations, such as a write operation, on host data that is stored on a memory device. For example, firmware of the memory sub-system may re-write previously written host data from a location of a memory device to a new location as part of garbage collection management operations. The data that is re-written, for example as initiated by the firmware, is hereinafter referred to as "garbage collection data."

"User data" hereinafter generally refers to host data and garbage collection data. "System data" hereinafter refers to data that is created and/or maintained by the memory sub-system for performing operations in response to host requests and for media management. Examples of system data include, and are not limited to, system tables (e.g., L2P data, P2L data, data from logging, scratch pad data, and so forth).

A memory device can be a non-volatile memory device. A non-volatile memory device is a package of one or more die. Each die can be comprised of one or more planes. For some types of non-volatile memory devices (e.g., AND-type devices), each plane is comprised of a set of physical blocks. For some memory devices, blocks are the smallest area that can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are a raw memory device combined with a local embedded controller for memory management within the same memory device package.

Generally, writing data to NAND-type memory devices involves programming (by way of a program operation) the NAND-type memory devices at the page level of a block, and erasing data from such memory devices involves erasing the memory devices at the block level (e.g., page level erasure of data is not possible). Certain memory devices, such as NAND-type memory devices, comprise one or more blocks, (e.g., multiple blocks) with each of those blocks comprising multiple pages, where each page comprises a subset of memory cells of the block, and where a single wordline of a block (which connects a group of memory cells of the block together) defines one or more pages of a block (depending on the type of memory cell). Depending on the embodiment, different blocks can comprise different types of memory cells. For instance, a block (a single-level cell (SLC) block) can comprise multiple SLCs, a block (a multi-level cell (MLC) block) can comprise multiple MLCs, a block (a triple-level cell (TLC) block) can comprise multiple TLCs, a block (a quad-level cell (QLC) block) can comprise QLCs, and a block (a penta-level cell (PLC) block) can comprise PLCs. Other blocks comprising other types of memory cells (e.g., higher-level memory cells, having higher bit storage-per-cell) are also possible.

Each worldline (of a block) can define one or more pages depending on the type of memory cells (of the block) connected to the wordline. For example, for an SLC block, a single wordline can define a single page. For an MLC block, a single wordline can define two pages—a lower page (LP) and an upper page (UP). For a TLC block, a single wordline can define three pages—a lower page (LP), an upper page (UP), and an extra page (XP). For a QLC block, a single wordline can define four pages—a lower page (LP), an upper page (UP), an extra page (XP), and a top page (TP) page. As used herein, a page of LP page type can be referred to as a "LP page," a page of UP page type can be referred to as a "UP page," a page of XP page type can be referred to as a "XP page," and a page of TP page type can be referred to as a "TP page." Each page type can represent a different level of a cell (e.g., QLC can have a first level for LPs, a second level for UPs, a third level for XPs, and a fourth level for TPs). To write data to a given page, a wordline associated with the given page is programmed according to a page programming algorithm (e.g., that causes one or more voltage pulses or pulses to memory cells of a block based on the memory). Generally, programming a single wordline of a block results all the pages in the single wordline being programmed, where the number pages being programmed depends on the type of block. For example, programming a single wordline of a QLC block usually results in four pages (e.g., LP, UP, XP, TP pages) associated with the single wordline being programmed.

In conventional a memory system (e.g., memory sub-system), a translation unit (TU) comprises a fixed-size data unit that can serve as the fundamental unit of data translation in the memory system's translation layer, which can serve as an intermediary that handles the mapping of logical memory addresses (e.g., LBAs) to physical memory addresses (corresponding to physical memory locations) of a memory device of the memory system. An individual TU can represent a specific amount of host data, typically 4 KB in size, that is managed, addressed, and tracked throughout the storage system. Each TU can have a unique logical memory address (unique within the memory system) that is mapped to a physical memory location in one of a set of memory devices of a memory system, with this mapping relationship maintained by tables of the translation layer. TUs can be valid or invalid depending on their current state in the memory system, and they can be organized within block stripes according to write sequences that are tracked by version numbers to maintain data validity and chronological order. An example of a data translation layer (that manages TUs) includes an SSD's Flash Translation Layer (FTL), which comprises a software layer in the SSD that manages the translation between logical memory addresses used by a host system and physical memory addresses in the NAND flash memory of the SSD. In SSDs, an FTL can manage wear leveling, garbage collection, and other SSD-specific operations.

Memory sub-systems, such as SSDs, continue to offer increasingly higher storage densities and, as storage density increases, the time needed to prepare memory sub-systems for performance testing also increases substantially. Generally, performance testing of a memory sub-system comprises the memory sub-systems reaching specific operational states before meaningful performance measurements can be taken from the memory sub-systems. Preparing the memory sub-system for testing usually involves sequential and random write operations across the entire capacity of the memory sub-system. For instance, making an SSD enter a steady operational state (or a steady state) can comprise performing a full drive sequential write twice, and then performing a full drive random write twice. A steady state can represent a condition where performance of a memory sub-system stabilizes after the memory sub-system has been subjected to sufficient write operations. For high-density memory sub-systems, the test preparation process can be extremely time-consuming. For example, preparing a memory sub-system to reach the steady state (which typically involves multiple full-capacity write cycles) can take 3 hours for a 8 TB SSD and 10 hours for a 32 TB SSD.

The internal architecture of memory sub-systems, such as SSDs, uses a system of block stripes and translation units (within individual blocks of block stripes) to manage data storage. As used herein, a block stripe can comprise blocks across multiple memory die planes of one or more memory die of the memory sub-system, where each block of the stripe shares the same logical or physical positional within its respective memory die plane. Each individual block stripe can have a version number (also referred to as a block stripe version) that indicates when in time the individual block stripe was open (e.g., created or allocated) for a data write. An individual block stripe is usually closed when all pages of the individual block stripe have been used (e.g., written to). A block stripe version can indicate the write sequence between different block stripes, while P2L data (e.g., P2L drop) associated with an individual block stripe can describe a write sequence of codewords (or TUs) within a given block stripe.

While memory sub-systems that use block stripes and TUs usually include one or more mechanisms for tracking data validity and write sequences to facilitate operation of the memory sub-systems, such mechanisms often add complexity to testing procedures, such as those of performance testing. Additionally, as the capacities of memory sub-systems continue to grow, the challenge of efficiently preparing memory sub-systems for testing becomes more pronounced, affecting both development cycles and quality assurance processes.

Various example embodiments described herein provide cloning a source memory system (e.g., a source memory sub-system) to a destination memory system (e.g., destination memory sub-system) based on block stripe versioning, which can be used to determine translation unit write sequences. In particular, various example embodiments enable a host system to use block stripe version numbers and data that describes a write sequence of TUs within individual block stripes to rapidly replicate one or more specific operational states of a source memory system (e.g., a source SSD) to a destination memory system (e.g., a destination SSD), which can enable or facilitate testing or performance evaluation of the destination memory system. Herein, a source memory system can represent a memory system that has already been prepared for testing (e.g., in a steady state for testing). For instance, the source memory system can be prepared by storing host data with sufficient randomization to facilitate its proper evaluation under a performance test. Use of various example embodiments can address the challenge of lengthy pre-conditioning processes required for memory system (e.g., SSD) testing, such as performance testing.

According to some example embodiments, a host system uses block stripe versioning of a source memory system and P2L data (e.g., P2L drop data) of the source memory system to efficiently clone the source memory system to a destination memory system. Block stripe versioning can effectively provide a host system (that is performing the cloning) with a timeline or timestamp information that indicates when a block stripe was allocated (or newly created) for writing. Each block stripe can be associated with a unique version number when opened, thereby allowing a memory system to determine the chronological sequence of block stripe allocations (e.g., creations). This versioning can enable the host system (that is performing the cloning) to identify which block stripes of the source memory system were opened earlier versus later in the overall write sequence of TUs to the source memory system.

P2L drop data (also referred to herein as just a P2L drop) can comprise information about TUs that have been translated by a translation layer (e.g., FTL) of the source memory system, where the information can include TU numbers for the TUs that have been written to a block stripe of the source memory system and the write sequence of those TUs within the block stripe. A P2L drop buffer of a source memory system can record this information during a write operation performed on a block stripe of the source memory system, and can write the data content of the P2L drop buffer to a memory device (e.g., within the block stripe) when the P2L drop buffer becomes full. A given block stripe can have one or more P2L drops associated with the given block stripe. For some example embodiments, all P2L drops for an individual block stripe can be saved in a single P2L drop file for the given block stripe. As a result, each block stripe can have an associated P2L drop file during a cloning process of an example embodiment. According to various example embodiments, block stripe versioning and P2L drops of block stripes of a source memory system provide a host system a complete picture of the write data sequence across the entire source memory system, which the host system then uses to clone the source memory system to a destination memory system.

According to some example embodiments, the cloning process is performed by a host system that is operatively coupled to a source memory system and a destination memory system. The cloning process can comprise the following sequence of operations. First, the destination memory system can be placed in an initial state (e.g., Fresh Out of Box (FOB) state) through a format operation (e.g., low-level format (LLF) operation) that erases all existing data. Second, certain operations of the destination memory system can be temporarily disabled on the destination memory system to optimize the cloning process. Examples of these operations can include, without limitation, folding operations and translation layer (e.g., FTL) writes. Disabling folding can prevent changes to the data layout of the destination memory system during the cloning process, and disabling translation layer writes can avoid unnecessary operations on the destination memory system during the cloning process. Third, the host system can access block stripe data from the source memory system. This data can comprise an ordered list of valid block stripes of the source memory system, where the ordered list can be sorted according to block stripe version numbers of those valid block stripes. As used herein, a valid block stripe can refer to a block stripe that stores valid data. For example, a valid block stripe can have a state of written, writing or folding. The host system can also access P2L data for block stripes (e.g., valid block stripes) of the source memory system. The P2L data can comprise P2L data dumps (e.g., P2L drop files) that each describe a write sequence of translation units within a corresponding block stripe. Fourth, based on information from the block stripe data and the P2L data, the host system can generate a sequence of write requests (e.g., each write request per a single TUs of the source memory system) to the destination memory sub-system. Specifically, for each valid block stripe, selected in order from smallest to largest version number, the host system can process the P2L data dump (e.g., P2L drop file) associated with the valid block stripe. Within each P2L data dump, individual translation units can be selected by the host system in order from the write sequence, the host system can determine whether each individual translation unit satisfies a condition to be written to the destination memory system, such as whether the individual translation unit stores host (or user) data or padding data. If the condition is met (e.g., the individual translation unit stores host data or padding data), a write request is generated based on that individual translation unit.

On the destination memory system, write requests received from the host system can be processed as normal writes (e.g., through the translation path), which means that new P2L drops, and other translation layer (e.g., FTL) data are synchronously generated on the destination memory (and not cloned from the source memory system). This approach can ensure that the L2P table, and VTC (Valid TU Count) table, and other tables are properly constructed on the destination memory system during the cloning process.

Fifth, after the host system finishes generating and sending write requests to the destination memory system (and all responsive write operations are completed on the destination memory system), the host system can enable previously disabled operations, such as folding operations and translation layer (e.g., FTL) writes. Additionally, the host system can trigger a snapshot of the L2P data on the destination memory sub-system to be generated and stored on the destination memory system. This can represent the end of the cloning process, and the destination memory system can be considered to be in a state that closely resembles the source memory system (e.g., ready for performance testing).

In some example embodiments, the host system handles special cases, such as padding TUs that cannot be written directly to the destination memory system because the padding TUs exceed the capacity, by using rewrite operations, where the host system finds a next TU storing host (or user) data and writing with this TU at the padding positions. Further, some example embodiments described herein accommodate differences between source and destination memory systems, such as different bad block deployments. While these differences can result in slight variations in data layouts between source and destination memory systems, these differences have minimal impact on the overall randomization of data, as the ratio of bad blocks is typically small.

Use of various example embodiments described herein can significantly reduce the time required to prepare a destination memory system for testing (e.g., performance testing). For instance, where preparing a destination memory system having 32 TB for steady-state testing traditionally takes over 10 hours, use of some example embodiments described herein can prepare the same destination memory system for steady-state testing in approximately 1.5 hours. Accordingly, use of various example embodiments can provide substantial time savings for engineering and testing workflows, while maintaining the necessary data randomization characteristics for accurate performance evaluation of destination memory systems.

As used herein, a physical memory address-to-logical memory address (P2L) drop can comprise a data structure in memory systems (e.g., SSDs) that records and maintains the translation information between physical and logical memory addresses during write operations on the memory systems. An individual P2L drop can comprise data content from a buffer of a memory system that temporarily stores the logical numbers associated with translation units (TUs) that have been translated by a translation layer (e.g., the FTL) before the TUs are written to a memory device (e.g., a NAND-type memory device) of the memory system; generally, the individual P2L drop is generated and stored in the memory device when the buffer becomes full. A P2L drop can record the specific TU numbers that have already been translated, and can record the chronological write sequence of these TUs. The sequential information can be used to determine data validity when multiple versions of the same logical address exist across different block stripes. Each individual block stripe can maintain one or more of its own P2L drops, and those P2L drops can be strategically positioned within the block stripe. The one or more P2L drops of an individual block stripe can collectively provide various example embodiments described herein with a comprehensive record of write operations for the individual block stripe, which can enable accurate state replication during memory system cloning processes.

Disclosed herein are some examples of cloning a memory system (e.g., a memory sub-system) based on block stripe versioning, as described herein.

FIG. 1 illustrates an example computing system 100 that includes a memory sub-system 110A and memory sub-system 110B, in accordance with some example embodiments of the present disclosure. Depending on the example embodiment, the memory sub-system 110A can represent a source memory sub-system and the memory sub-system 110B can represent a destination memory sub-system, or vice versa. Additionally, depending on the example embodiment, the implementation of the memory sub-system 110B can be similar to that of memory sub-system 110A, or could be different. Though the following describes memory sub-system 110A in greater detail than memory sub-system 110B, it will be understood that those additional details could also apply to memory sub-system 110B.

The memory sub-system 110A can include media, such as one or more volatile memory devices (e.g., memory device 140), one or more non-volatile memory devices (e.g., memory device 130), or a combination of such. The memory sub-system 110A can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. The computing system 100 can be used to support or implement various types of applications, including those relating to artificial intelligence (AI).

The computing system 100 can include a host system 120 that is coupled to one or more memory sub-systems (e.g., 110A, 110B). In some example embodiments, the host system 120 is coupled to different types of memory sub-systems. FIG. 1 illustrates one example of a host system 120 coupled to memory sub-system 110A and memory sub-system 110B. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110A, memory sub-system 110B, or both, for example, to write data to the memory sub-system 110A or 110B and read data from the memory sub-system 110A or 110B.

The host system 120 can include or be coupled to the memory sub-system 110A or memory sub-system 110B so that the host system 120 can read data from or write data to the memory sub-system 110A or memory sub-system 110B. The host system 120 can be coupled to the memory sub-system 110A or memory sub-system 110B via a physical host interface. Examples of a physical host interface include, but are not limited to, a serial advanced technology attachment (SATA) interface, a peripheral component interconnect express (PCIe) interface, a compute express link (CXL) interface, a universal serial bus (USB) interface, a Fibre Channel interface, a Serial Attached SCSI (SAS) interface, etc. The physical host interface can be used to transmit data between the host system 120 and the memory sub-system 110A or memory sub-system 110B. The host system 120 can further use an NVM Express (NVMe) interface to access the memory devices 130, 140 when the memory sub-system 110A is coupled with the host system 120 by the PCIe or CXL interface. The physical host interface can provide an interface for passing control, address, data, and other signals between the memory sub-system 110A and the host system 120 or the memory sub-system 110B and the host system 120.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional (2D) NAND and 3D NAND.

Each of the memory devices 130, 140 can include one or more arrays of memory cells. One type of memory cell, for example, SLCs, can store one bit per cell. Other types of memory cells, such as MLCs, TLCs, QLCs, and penta-level cells (PLCs), can store multiple bits per cell. In some example embodiments, each of the memory devices 130, 140 can include one or more arrays of memory cells such as SLCs, MLCs, TLCs, QLCs, or any combination of such. In some example embodiments, a particular memory device can include an SLC portion, and an MLC portion, a TLC portion, or a QLC portion of memory cells. The memory cells of the memory devices 130, 140 can be grouped as pages that can refer to a logical unit of the memory device used to store data. With some types of memory (e.g., NAND), pages can be grouped to form blocks. As used herein, a block comprising SLCs can be referred to as a SLC block, a block comprising MLCs can be referred to as an MLC block, a block comprising TLCs can be referred to as a TLC block, a block comprising QLCs can be referred to as a QLC block, and a block comprising PLCs can be referred to as a PLC block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative- or (NOR) flash memory, and electrically erasable programmable read-only memory (EEPROM).

A memory sub-system controller 115 (or controller 115 for simplicity) can communicate with the memory devices 130, 140 to perform operations such as reading data, writing data, or erasing data at the memory devices 130, 140 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110A, including handling communications between the memory sub-system 110A and the host system 120.

In some example embodiments, the local memory 119 can include memory registers storing memory pointers, fetched data, and so forth. The local memory 119 can also include ROM for storing micro-code. While the example memory sub-system 110A in FIG. 1 has been illustrated as including the memory sub-system controller 115, in another example embodiment of the present disclosure, a memory sub-system 110A does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and ECC operations, encryption operations, caching operations, and address translations between a logical address (e.g., LBA, namespace) and a physical memory address (e.g., physical block address) that are associated with the memory devices 130, 140. The memory sub-system controller 115 can further include host interface circuitry to communicate with the host system 120 via the physical host interface. The host interface circuitry can convert the commands received from the host system 120 into command instructions to access the memory device 130 and/or the memory device 140 as well as convert responses associated with the memory device 130 and/or the memory device 140 into information for the host system 120.

The memory sub-system 110A can also include additional circuitry or components that are not illustrated. In some example embodiments, the memory sub-system 110A can include a cache or buffer (e.g., DRAM) and address circuitry (e.g., a row decoder and a column decoder) that can receive an address from the memory sub-system controller 115 and decode the address to access the memory devices 130, 140.

In some example embodiments, the memory device 130 includes local media controller 135 that operates in conjunction with memory sub-system controller 115 to execute operations on one or more memory cells of the memory device 130. An external controller (e.g., memory sub-system controller 115) can externally manage the memory device 130 (e.g., perform media management operations on the memory device 130). In some example embodiments, a memory device 130 is a managed memory device, which is a raw memory device combined with a local controller (e.g., local media controller 135) for media management within the same memory device package. An example of a managed memory device is a managed NAND (MNAND) device.

The host system 120 includes a memory system cloner based on block stripe data and P2L data 113 (hereafter, the memory system cloner 113) that enables the host system 120 (a processor thereof) to clone a source memory system (e.g., memory sub-system 110A) to a destination memory system (e.g., memory sub-system 110B) based block stripe data and P2L data of the source memory sub-system in accordance with various example embodiments described herein, where the block stripe data can provide versioning information for block stripes of the source memory sub-system and the P2L data can provide information regarding translation unit write sequences within individual block stripes. Alternatively, some or all of the memory system cloner 113 can be included by the memory sub-system controller 115 or the local media controller 135 of the memory device 130, to enable or facilitate the cloning of the source memory sub-system to the destination memory sub-system.

Figure 2:
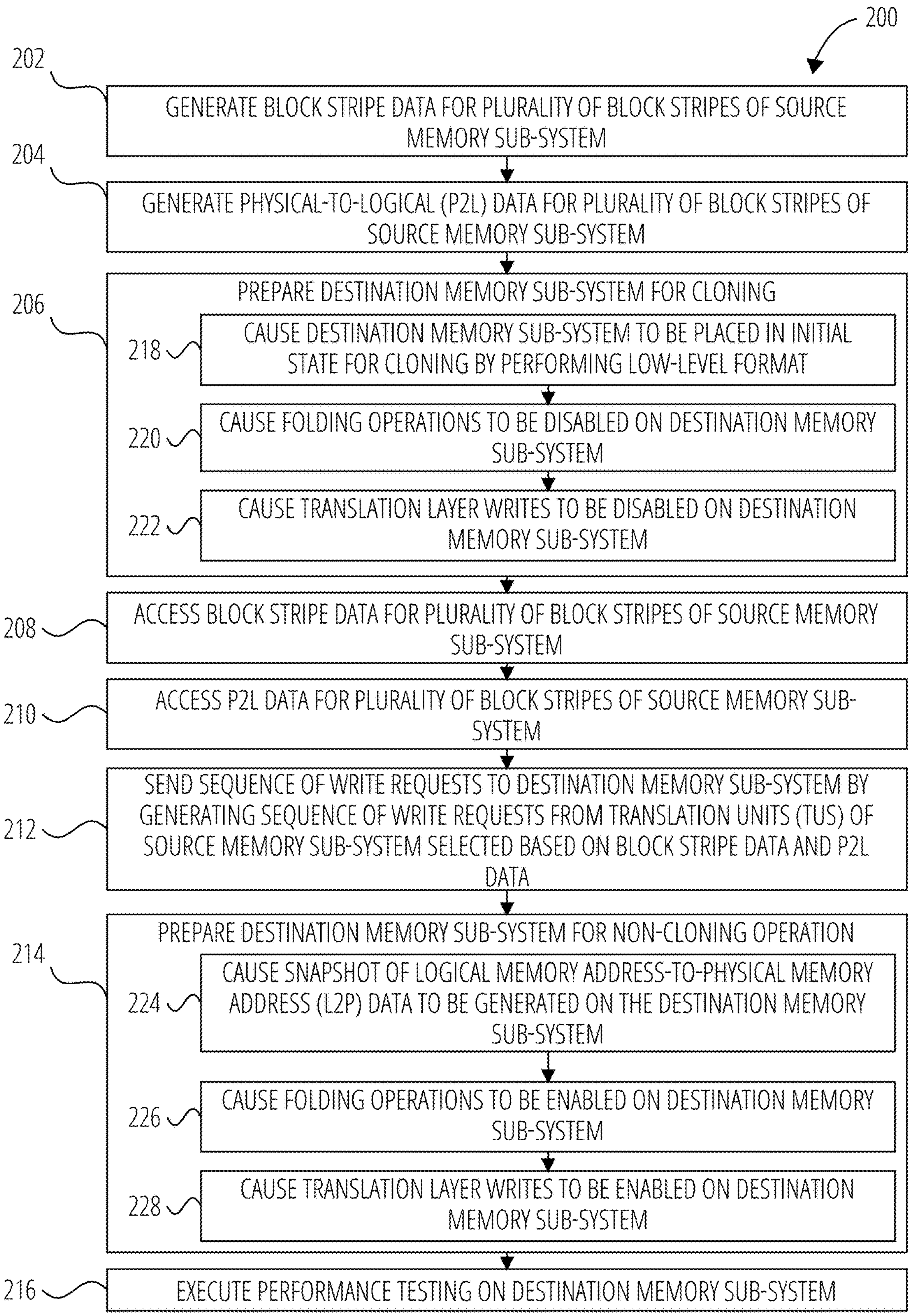
FIG. 2 and FIG. 3 are flow diagrams of example methods for cloning a source memory system to a destination memory system based on block stripe versioning, in accordance with some example embodiments of the present disclosure.
Figure 3:
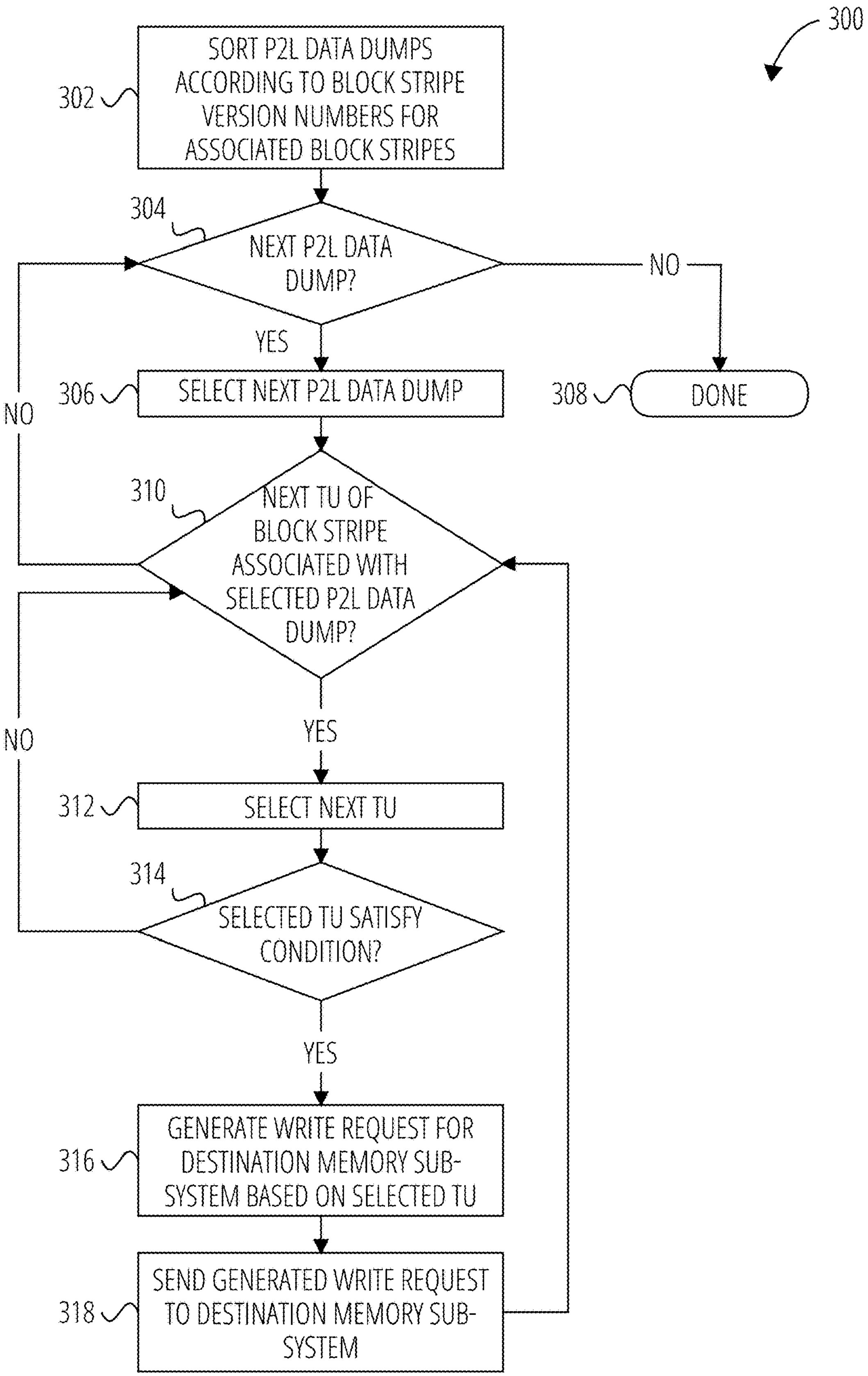

FIG. 2 and FIG. 3 are flow diagrams of example methods 200, 300 for cloning a source memory system (e.g., a source memory sub-system) to a destination memory system (e.g., destination memory sub-system) based on block stripe versioning, in accordance with some example embodiments of the present disclosure. Any of methods 200, 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some example embodiments, any of the methods 200, 300 is performed by the host system 120 of FIG. 1 based on the memory system cloner 113, where the host system 120 can perform it with respect to the memory sub-system 110A of FIG. 1, memory sub-system 110B of FIG. 1, or both. Although shown in a particular sequence or order, unless otherwise specified, the order of the processes can be modified. Thus, the illustrated example embodiments should be understood only as examples, and the illustrated processes can be performed in a different order, and some processes can be performed in parallel. Additionally, one or more processes can be omitted in various example embodiments. Thus, not all processes are used in every example embodiment. Other process flows are possible.

Referring now to the method 200 of FIG. 2, at operation 202, a processing device (e.g., of the host system 120) generates block stripe data for a plurality of block stripes of a source memory sub-system, which can involve the processing device collecting block stripe information from the source memory sub-system. The source memory sub-system can represent a memory sub-system that has already been prepared (e.g., storing data with sufficient randomization) for testing, such as performance testing. An individual block stripe (of the plurality of block stripes) store data. For various example embodiments, the block stripe data comprises an ordered list of valid block stripes that is ordered according to block stripe version numbers of those valid block stripes. For example, the ordered list of valid block stripes can be sorted from a block stripe version number (e.g., smallest block stripe version number) corresponding to the oldest block stripe of the source memory sub-system to a block stripe version number (e.g., largest block stripe version number) corresponding to the newest/latest block stripe of the source memory sub-system. During the collection of block stripe information from the source memory sub-system, the processing device can retrieve the block stripe information from the source memory sub-system, determining (e.g., identify) a list of valid block stripes in the plurality of block stripes based on the retrieved block stripe information, and generate the ordered list of valid block stripes by sorting the list of valid block stripes based on a respective block stripe version number of each valid block stripe in the list of valid block stripes.

At operation 204, the processing device generates physical-to-logical (P2L) data for the plurality of block stripes of the source memory sub-system, which can involve the processing device collecting P2L information from the source memory sub-system. For various example embodiments, where the P2L data comprises a plurality (e.g., collection) of P2L data dumps of the plurality of block stripes, where a select P2L data dump (of the plurality of P2L data dumps) is associated with a select block stripe of the plurality of block stripes. The plurality of P2L data dumps can comprise an individual P2L data dump for each block stripe of the plurality of block stripes. According to various example embodiments, each individual P2L data dump describes a write sequence of translation units within an individual block stripe associated with the individual P2L data dump. Depending on the example embodiment, an individual P2L data dump (associated with an individual block stripe) can comprise a P2L drop file that stores one or more P2L drops of the individual block stripe. An example of a P2L drop is illustrated and described with respect to FIG. 6.

During the collection of P2L information from the source memory sub-system, the processing device can perform one or more of the following operations with respect to an individual block stripe (e.g., with respect to each individual block stripe) of the plurality of block stripes. The processing device can retrieve, from the source memory sub-system, a memory address of each valid P2L drop within the individual block stripe (e.g., where the individual block stripe can comprise multiple P2L drops), and based on the retrieved memory addresses, the processing device can retrieve, from the source memory sub-system, data content of each valid P2L drop within the individual stripe. For various example embodiments, the data content of each valid P2L drop indicates a write sequence of translation units within at least a portion of the individual block stripe.

For operation 206, the processing device prepares (or causes preparation of) the destination memory sub-system for cloning. As a result of preparing the destination memory sub-system, the plurality of block stripes of the destination memory sub-system store host (or user) data that places the destination memory sub-system in a steady state for testing (e.g., performance testing). During operation 206, the processing device performs one or more of operations 218, 220, 222. At operation 218, the processing device causes the destination memory sub-system to be placed in an initial state (e.g., Fresh Out of Box (FOB) state) through a format operation (e.g., LLF operation) that erases all existing data. At operation 220, the processing device causes folding operations to be disabled on the destination memory sub-system. Additionally, at operation 222, the processing device causes translation layer (e.g., FTL) writes to be disabled on the destination memory sub-system.

During operation 208, the processing device accesses the block stripe data for the plurality of block stripes of the source memory sub-system. As described herein, the block stripe data can comprise an ordered list of valid block stripes that is ordered according to block stripe version number. At operation 210, the processing device accesses the P2L data for the plurality of block stripes of the source memory sub-system. As described herein, the P2L data can comprise the plurality of P2L data dumps of the plurality of block stripes. Each individual P2L data dump can describe a write sequence of translation units within an individual block stripe. Additionally, the plurality of P2L data dumps can comprise an individual P2L data dump for each block stripe of the plurality of block stripes.

At operation 212, the processing device sends a sequence of write requests to the destination memory sub-system, where the sending comprises generating the sequence of write requests from translation units of the source memory sub-system selected based on the ordered list of valid block stripes (from the block stripe data accessed at operation 208) and the plurality of P2L data dumps (from the P2L data accessed at operation 210). According to various example embodiments, operation 212 comprises the processing device determines (e.g., identifies), from the plurality of P2L data dumps, a set of P2L data dumps for (e.g., corresponding to) the ordered list of valid block stripes provided by the block stripe data (accessed at operation 208), and generates an ordered set of P2L data dumps by sorting the set of P2L data dumps according to the ordered list of valid block stripes. For example, where the ordered list of valid block stripes is ordered from the smallest block stripe version number (corresponding to the oldest block stripe of the source memory sub-system) to the largest block stripe version number (corresponding to the newest/latest block stripe of the source memory sub-system), the ordered set of P2L data dumps would also be ordered according from the smallest block stripe version number to the largest block stripe number. For each individual P2L data dump selected in order from the ordered set of P2L data dumps, the processing device can access (e.g., process) the individual P2L data dump that corresponds to an individual valid block stripe of the plurality of block stripes, where the individual P2L data dump describes a write sequence of translation units within the individual block stripe. Then, for each individual translation unit selected in order from the write sequence of translation units within the individual block stripe, the processing device can determine whether the individual translation unit satisfies a condition to be written to the destination memory sub-system, and in response to determining that the individual translation unit satisfies the condition (to be written to the destination memory sub-system), the processing device generates a write request for the destination memory sub-system based on the individual translation unit (e.g., a write request to write the individual TU to the destination memory sub-system) and sends the generated write request to the destination memory sub-system. As the processing device processes through each of the P2L data dumps and each of the TUs described by those P2L data dumps, the processing device ends up sending a sequence of write requests to the destination memory sub-system. According to some example embodiments, performing operation 212 effectively causes a processing device to process P2L data dumps (e.g., P2L drop files) in view of the ordered list of valid block stripes such that the processing device generates write requests one TU of one block stripe at a time. An example of this process is illustrated and described with respect to FIG. 3.

For operation 214, the processing device prepares (or causes preparation of) the destination memory sub-system for non-cloning operation. During operation 214, the processing device performs one or more of operations 224, 226, 228. At operation 224, the processing device causes a snapshot of L2P data to be generated (and stored) on the destination memory sub-system. The snapshot of L2P data can represent a flush of a whole L2P table of the destination memory sub-system, which is generated and updated by the destination memory sub-system during operation 212. At operation 226, the processing device causes folding operations to be (re) enabled on the destination memory sub-system. Additionally, at operation 228, the processing device causes translation layer (e.g., FTL) writes to be (re) enabled on the destination memory sub-system.

When the operation 214 ends, the destination memory sub-system can be considered to be in a steady state (e.g., has sufficient data randomization) for testing, such as performance testing. Accordingly, at operation 216, the processing device executes (or causes execution) of a performance test or another test (e.g., another test that needs a memory system to be in a steady state prior to starting the test) on the destination memory sub-system.

Referring now to FIG. 3, method 300 represents an example method for sending a sequence of write requests to a destination memory sub-system as part of a cloning process as described herein. For example, method 300 can represent an implementation of operation 212 of method 200 as illustrated and described with respect to FIG. 2. At operation 302, a processing device (e.g., of the host system 120) sorts a plurality of P2L data dumps (e.g., P2L drop files) associated with a plurality of block stripes (e.g., valid block stripes) of a source memory sub-system, where the plurality of P2L data dumps are sorted according to block stripe version numbers of the plurality of block stripes. For instance, the P2L data dumps can be sorted from the smallest block stripe version number (corresponding to the oldest block stripe of the source memory sub-system) to the largest block stripe version number (corresponding to the newest/latest block stripe of the source memory sub-system). Operation 302 can result in a sorted set of P2L data dumps that the processing device will process via the remainder of method 300.

At decision block 304, the processing device determines the existence of a next P2L data dump in the sorted set of P2L data dumps (e.g., at the first iteration of decision block 304, this would be the first P2L data dump) that still needs to be processed by the processing device in accordance with method 300. In response to the processing device determining at decision block 304 that the next P2L data dump exists, method 300 proceeds to operation 306, where the processing device selects the next P2L data dump for processing. However, in response to the processing device determining at decision block 304 that the next P2L data dump does not exist, method 300 proceeds to end of method 300 (at 308).

After operation 306, at decision block 310, the processing device determines the existence of a next TU of a current block stripe (of the source memory sub-system) that is described by the selected P2L data dump (e.g., at the first iteration of decision block 310 for the selected P2L data dump, this would be the TU) and still needs to be processed by the processing device in accordance with method 300. In response to the processing device determining at decision block 310 that the next TU of the current block stripe exists, method 300 proceeds to operation 312, where the processing device selects the next TU for processing. However, in response to the processing device determining at decision block 310 that the next TU of the current block stripe does not exist, method 300 returns to decision block 304, where the processing device determines the existence of another (next) P2L data dump in the sorted set of P2L data dumps that still needs to be processed by the processing device in accordance with method 300.

After operation 312, at decision block 314, the processing device determines whether the selected TU (of the source memory sub-system) satisfies a condition to be written to the destination memory sub-system. Depending on the example embodiment, the condition can be satisfied if the selected TU is storing host (or user) data or the selected TU is storing padding data. Other conditions could also be possible. In response to the processing device determining at decision block 314 that the selected TU satisfies the condition, method 300 proceeds to operation 316, where the processing device generates a write request for the destination memory sub-system based on the selected TU (e.g., a write request to write the selected TU to the destination memory sub-system). At operation 318, the processing device sends the generated write request to the destination memory sub-system.

The series of write requests eventually generated and sent by the processing device (as a result of performing operations 316 and 318 multiple times) form a sequence of write requests that the processing device (of the host system) sends to the destination memory sub-system. After operation 318, method 300 returns to decision block 310, where the processing device determines the existence of another (next) TU that is described by the selected P2L data dump and still needs to be processed by the processing device in accordance with method 300.

Figure 4:
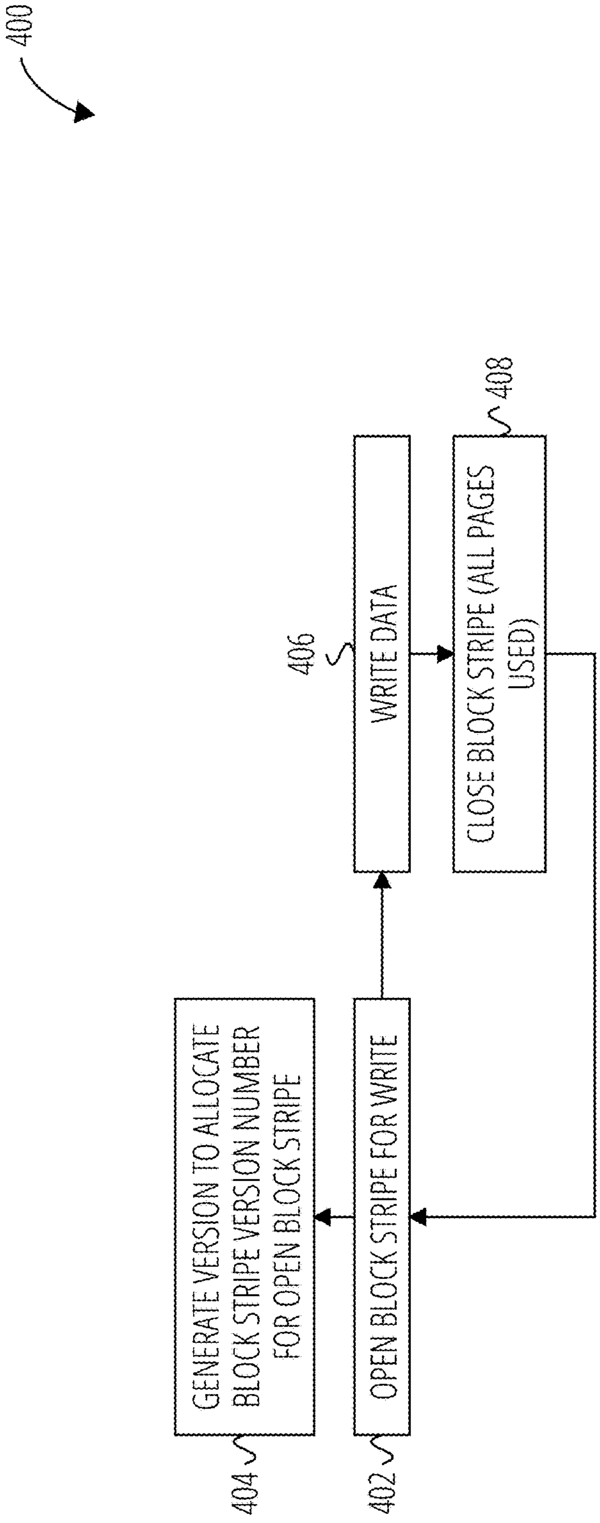
FIG. 4 is a flow diagram illustrating how block stripe version numbers are generated on a memory system, in accordance with some example embodiments of the present disclosure.

FIG. 4 is a flow diagram illustrating how block stripe version numbers are generated on a memory system (e.g., memory sub-system), in accordance with some example embodiments of the present disclosure. At operation 402, a processing device of a memory system (e.g., destination memory sub-system) is open (e.g., created or provisioned) on a memory device of the memory system for data writes on the memory system. Additionally, at operation 404, the processing device generates a new (e.g., a next) block stripe version number for the block stripe opened at operation 402. As a result, block stripe version numbers can be used to decide which block stripe is opened ahead and behind, and can indicate the time when the block stripe is opened for writing. During operation 406, the processing device of the memory system writes data to at least a portion (e.g., one or more pages) of the open block stripe. Eventually, when all pages of the open block stripe have been used (e.g., all pages have been written to), at operation 408, the processing device closes the open block stripe. If and when there is more data to be written to the memory device of the memory system, method 400 returns to operation 402, where another block stripe is open for data writing and another block stripe version is allocated for the open block stripe.

Figure 5:
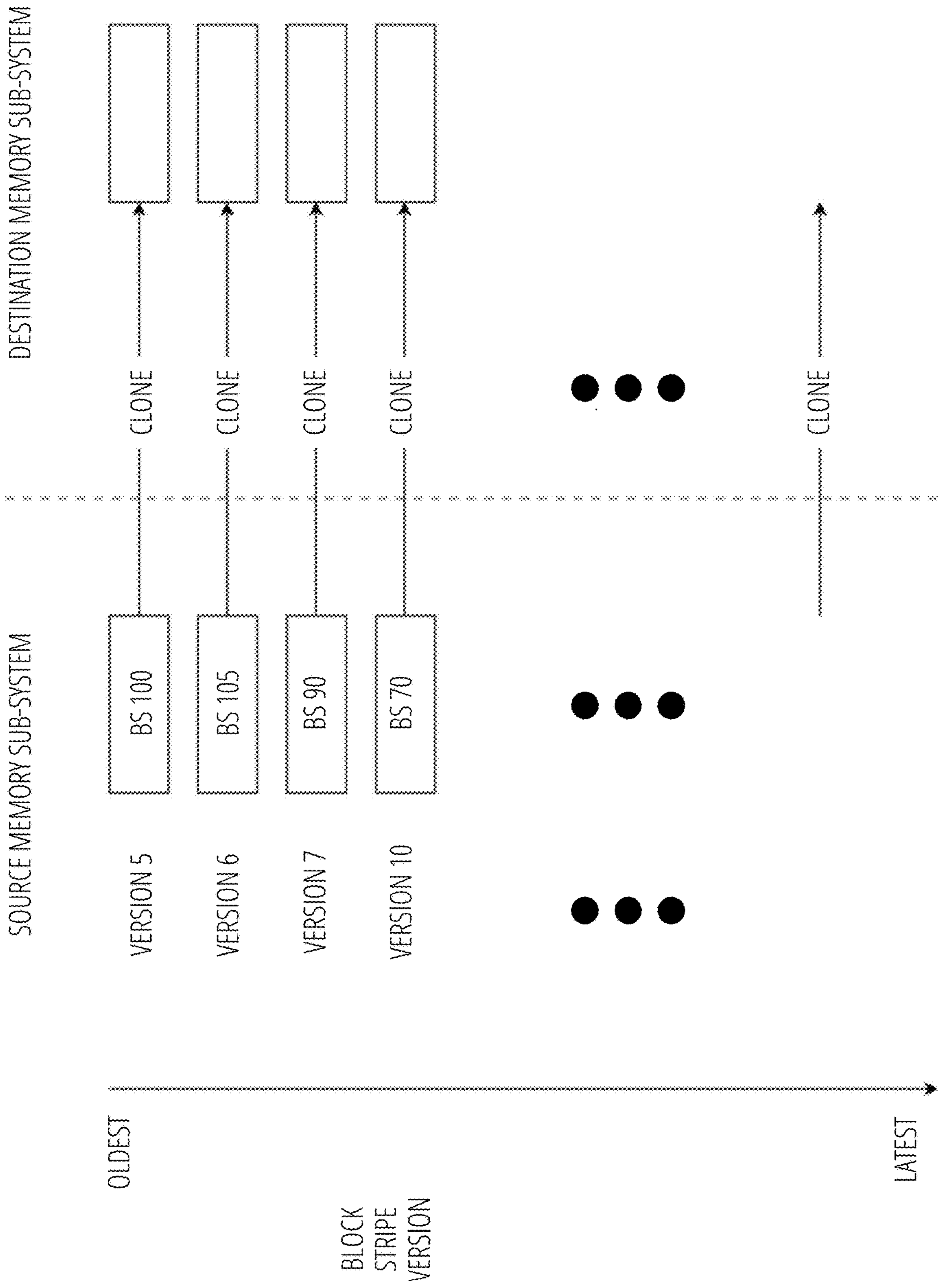
FIG. 5 is a diagram illustrating an example ordering of block stripes according to block stripe version numbers, in accordance with some example embodiments of the present disclosure.

FIG. 5 is a diagram illustrating an example ordering of block stripes according to block stripe version numbers, in accordance with some example embodiments of the present disclosure. In particular, FIG. 5 illustrates how the smallest block stripe version number represent the oldest block stripe on a source memory sub-system, the largest block stripe represents the newest/latest block stripe on the source memory sub-system, and how a host system clones TUs from the block stripes from the source memory sub-system to a destination memory sub-system according to this order.

Figure 6:
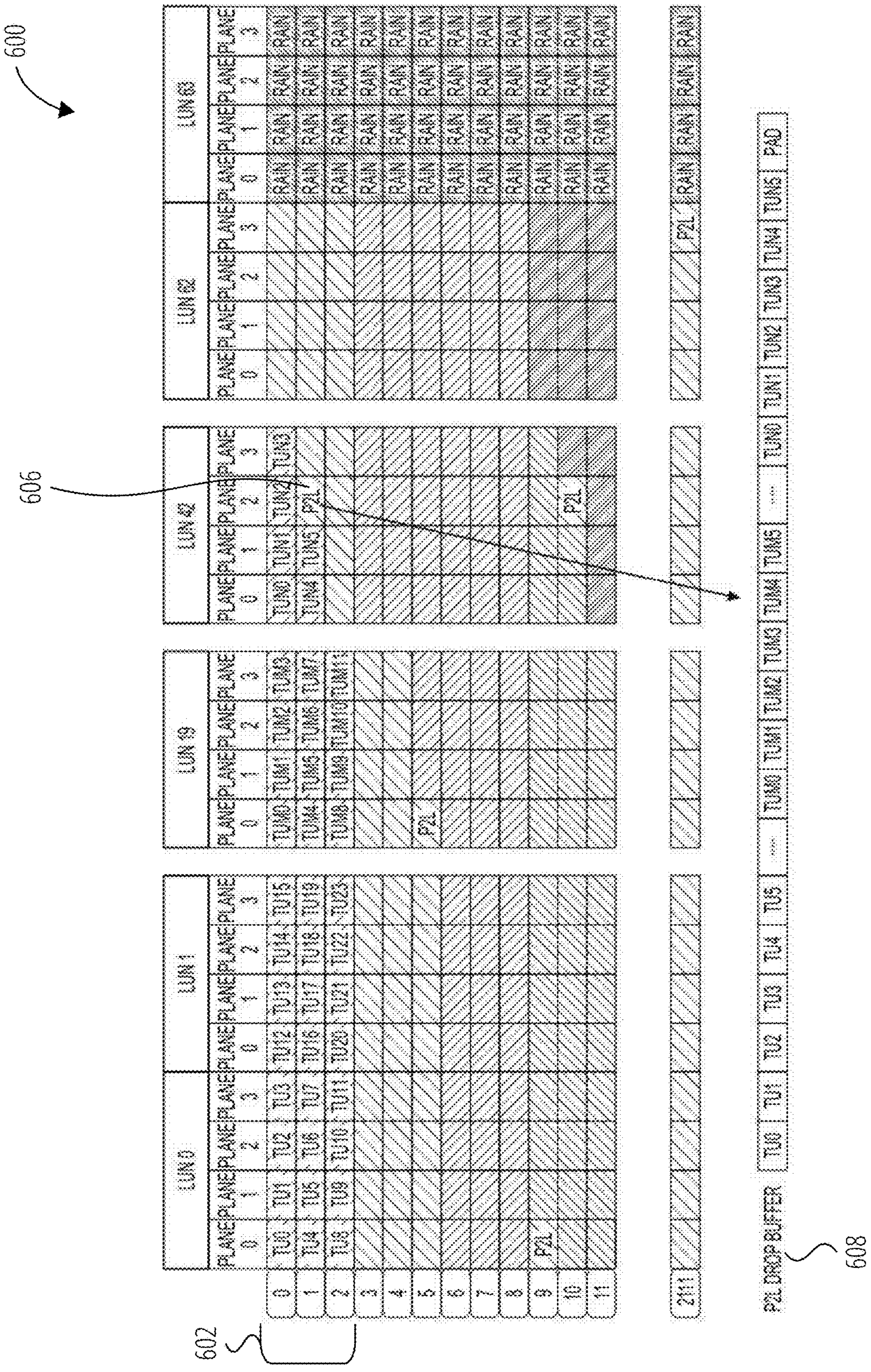
FIG. 6 illustrates an example data layout across one or more memory devices of a memory system, in accordance with some example embodiments of the present disclosure.

FIG. 6 illustrates an example data layout 600 across one or more memory devices of a memory system (e.g., memory sub-system), in accordance with some example embodiments of the present disclosure. In FIG. 6, the data layout 600 comprises logical unit numbers (LUNs) 0 through 63 (e.g., each LUN representing a different memory die of a memory device), with each LUN comprising memory die planes 0 through 3. Each memory die plane comprises pages 0 through 2111, where each page can store a TU. As shown, a block stripe 602 comprises TU0 through TU23, TUM0 through TUM11, and TUN0 through TUN5. The write sequence of TU numbers for block stripe 602 is stored in a P2L drop buffer 608 of the memory system (e.g., a source memory sub-system), and when the P2L drop buffer 608 is full, the data content of the P2L drop buffer 608 is stored to the memory system as a P2L drop 606.

Figure 7:
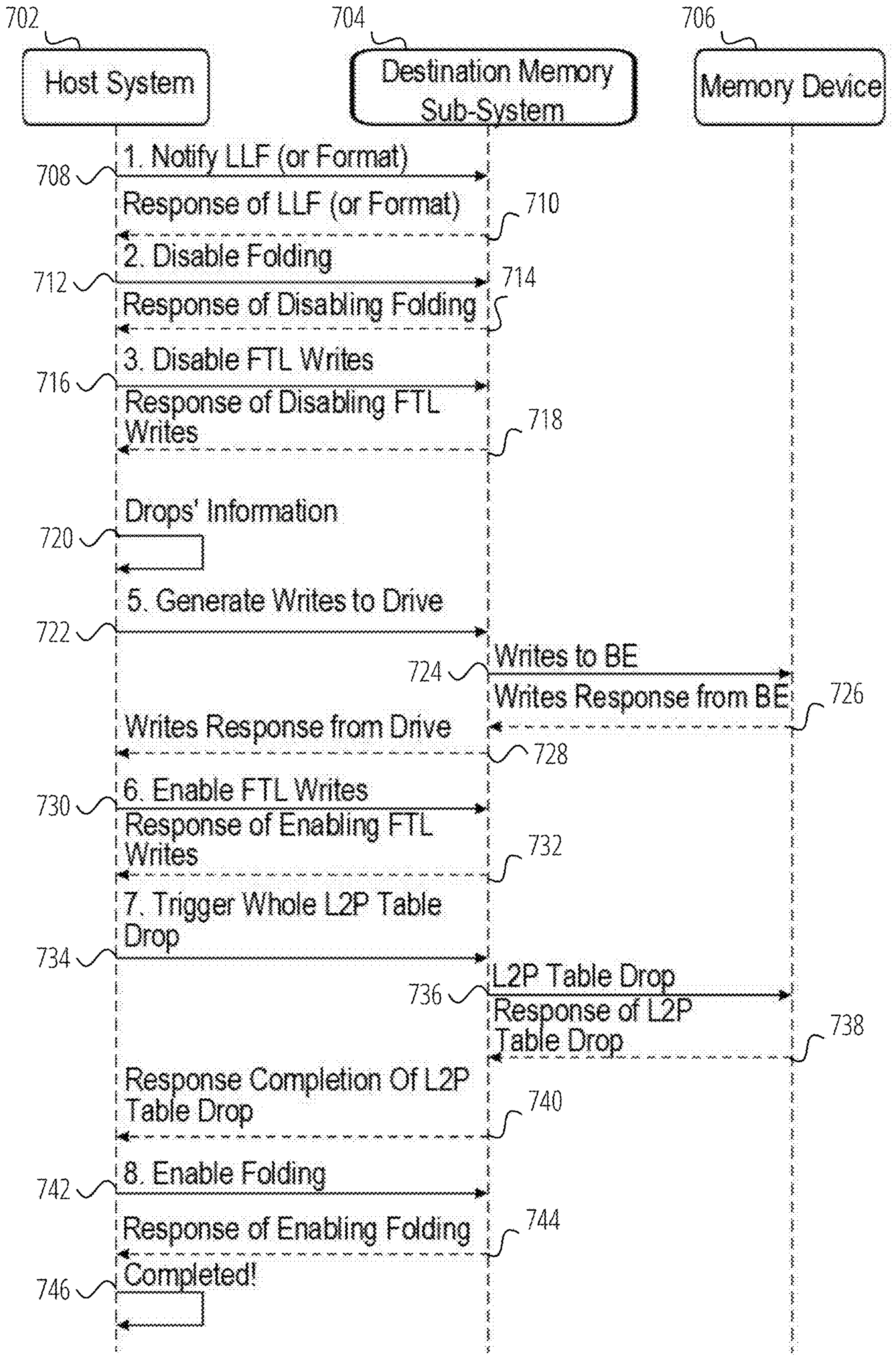
FIG. 7 is a swim lane diagram illustrating interactions between a host system, a destination memory sub-system, and a memory device of the destination memory sub-system during a cloning process, in accordance with some example embodiments of the present disclosure.

FIG. 7 is a swim lane diagram illustrating interactions between a host system 702, a destination memory sub-system 704, and a memory device 706 of the destination memory sub-system 704 during a cloning process, in accordance with some example embodiments of the present disclosure. In particular, the diagram depicts steps of a data flow and operation performed during the cloning of a source memory system to the destination memory sub-system 704 based on block stripe versioning, which can be used to determine translation unit write sequences.

At step 708, the host system 702 initiates a cloning process by making the destination memory sub-system 704 be in clean state (with no valid data), such as sending a Low-Level Format (LLF) or NVMe format command to the destination memory sub-system 704, which responds with a confirmation at step 710. At step 712, the host system 702 sends a command to disable folding operations on the destination memory sub-system 704, which acknowledges this with a response at step 714. Additionally, at step 716, the host system 702 sends a command to disable FTL writes on the destination memory sub-system 704, which confirms this operation at step 718. Eventually, at step 720, the host system 702 retrieves drop information from a destination memory sub-system 704, which includes block stripe data and P2L data from the source memory sub-system.

The host system 702 generates and sends write requests to the destination memory sub-system 704 at step 722, and the destination memory sub-system 704 forwards these generated writes to a back-end (BE) memory device 706 at step 724. The memory device 706 processes the writes and sends responses back to the destination memory sub-system 704 at step 726, and the destination memory sub-system 704 relays them to the host system 702 at step 728.

After completing the writes to the destination memory sub-system 704, the host system 702 sends a command to re-enable FTL writes on the destination memory sub-system 704 at step 730, and the destination memory sub-system 704 confirms this operation at step 732. To place the destination memory sub-system 704 in a working/non-cloning operational state and ready for testing (e.g., performance testing), at step 734, the host system 702 causes (e.g., triggers) a L2P table drop to be generated on the destination memory sub-system 704. In response, the destination memory sub-system 704 performs the L2P table drop to the memory device 706 at step 736, which responds at step 738. At step 740, the destination memory sub-system 704 then confirms a completion of the L2P table drop to the host system 702. Finally, at step 742, the host system 702 sends a command to re-enable folding operations on the destination memory sub-system 704, which confirms this operation at step 744. The cloning process concludes at step 746, with the host system 702 indicating the successful completion of the cloning process.

Figure 8:
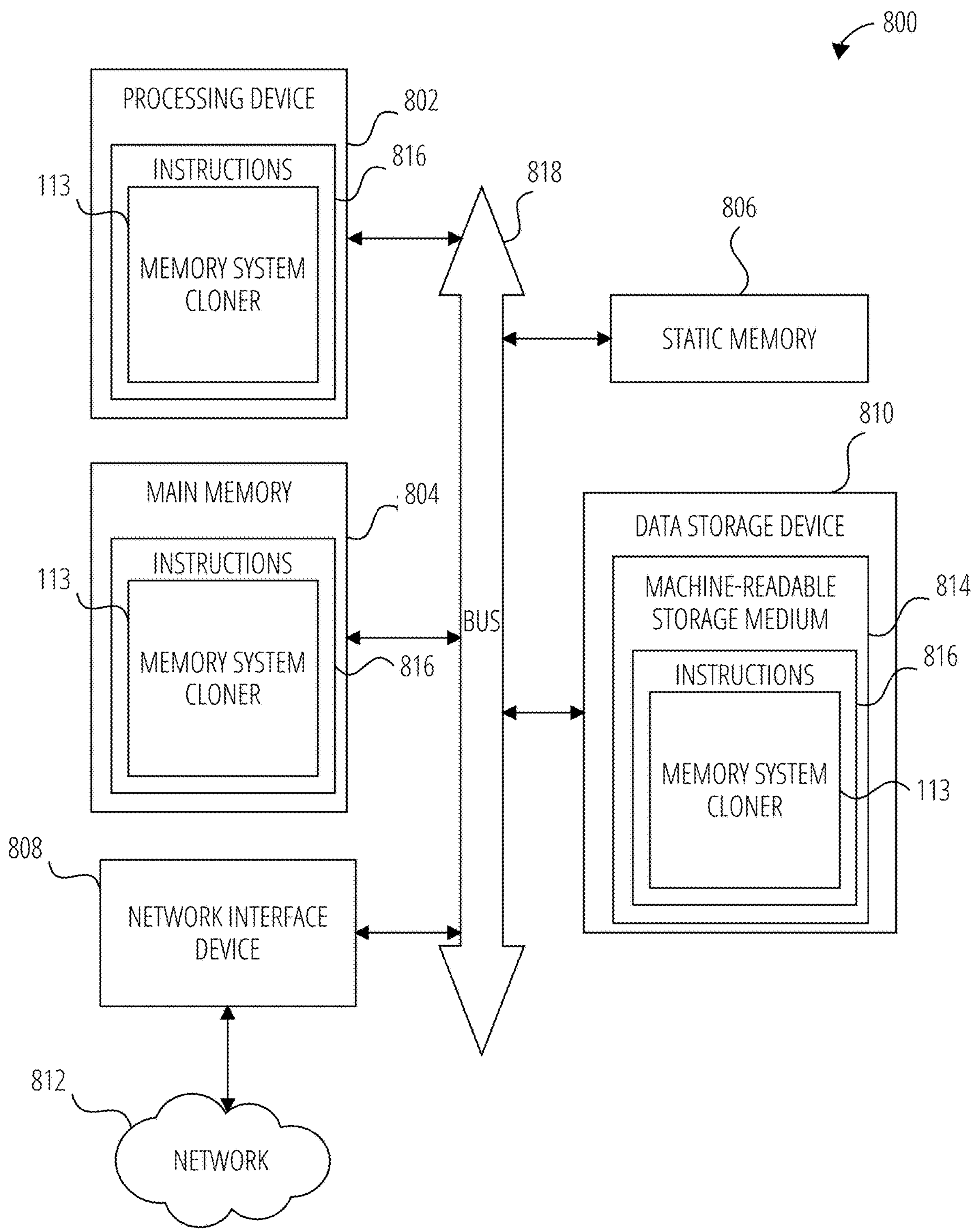
FIG. 8 is a block diagram of an example computer system in which example embodiments of the present disclosure may operate.

FIG. 8 illustrates an example machine in the form of a computer system 800 within which a set of instructions can be executed for causing the machine to perform any one or more of the methodologies discussed herein. In some example embodiments, the computer system 800 can correspond to a host system (e.g., the host system 120 of FIG. 1) that includes, is coupled to, or utilizes a memory sub-system (e.g., the memory sub-system 110A and the memory sub-system 110B of FIG. 1) or can be used to perform the operations described herein. In alternative example embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., ROM, flash memory, DRAM such as SDRAM or Rambus DRAM (RDRAM), etc.), a static memory 806 (e.g., flash memory, static random access memory (SRAM), etc.), and a data storage device 810, which communicate with each other via a bus 818.

The processing device 802 represents one or more general-purpose processing devices such as a microprocessor, a central processing unit, or the like. More particularly, the processing device 802 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 802 can also be one or more special-purpose processing devices such as an application-specific integrated circuit (ASIC), a field programmable gate array (FPGA), a digital signal processor (DSP), a network processor, or the like. The processing device 802 is configured to execute instructions 816 for performing the operations and steps discussed herein. The computer system 800 can further include a network interface device 808 to communicate over a network 812.

The data storage device 810 can include a machine-readable storage medium 814 (also known as a computer-readable medium) on which is stored one or more sets of instructions 816 or software embodying any one or more of the methodologies or functions described herein. The instructions 816 can also reside, completely or at least partially, within the main memory 804 and/or within the processing device 802 during execution thereof by the computer system 800, the main memory 804 and the processing device 802 also constituting machine-readable storage media. The machine-readable storage medium 814, data storage device 810, and/or main memory 804 can correspond to the memory sub-system 110A or the memory sub-system 110B of FIG. 1.

In one example embodiment, the instructions 816 include instructions (e.g., the memory system cloner 113 of FIG. 1) to implement functionality corresponding to clone a source memory system (e.g., memory sub-system 110A) to a destination memory system (e.g., memory sub-system 110B) based on block stripe versioning as described herein. While the machine-readable storage medium 814 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Described implementations of the subject matter can include one or more features, alone or in combination as illustrated below by way of examples.

Example 1 is a system comprising: a memory storing instructions; and a processing device operatively coupled to the memory, to a destination memory sub-system, and to a source memory sub-system that comprises one or more memory devices, the one or more memory devices comprising a plurality of block stripes storing data, the instructions causing the processing device to perform operations that comprise: accessing block stripe data for the plurality of block stripes of the source memory sub-system, the block stripe data comprising an ordered list of valid block stripes that is ordered according to block stripe version numbers of valid block stripes; accessing physical-to-logical (P2L) data for the plurality of block stripes of the source memory sub-system, the P2L data comprising a plurality of P2L data dumps of the plurality of block stripes, the plurality of P2L data dumps comprising a select P2L data dump associated with a select block stripe of the plurality of block stripes, the select P2L data dump describing a write sequence of translation units within the select block stripe; and sending a sequence of write requests to the destination memory sub-system, the sending of the sequence of write requests comprising generating the sequence of write requests from translation units of the source memory sub-system selected based on the ordered list of valid block stripes and the plurality of P2L data dumps.

In Example 2, the subject matter of Example 1 includes, wherein the generating of the sequence of write requests from translation units of the source memory sub-system selected based on the ordered list of valid block stripes and the plurality of P2L data dumps comprises: determining, from the plurality of P2L data dumps, a set of P2L data dumps for the ordered list of valid block stripes; generating an ordered set of P2L data dumps by sorting the set of P2L data dumps according to the ordered list of valid block stripes; and for each individual P2L data dump selected in order from the ordered set of P2L data dumps: accessing the individual P2L data dump, the individual P2L data dump corresponding to an individual valid block stripe of the plurality of block stripes, the individual P2L data dump describing a write sequence of translation units within the individual block stripe; and for each individual translation unit selected in order from the write sequence of translation units within the individual block stripe: determining whether the individual translation unit satisfies a condition to be written to the destination memory sub-system; and in response to determining that the individual translation unit satisfies the condition to be written to the destination memory sub-system, generating a write request for the destination memory sub-system based on the individual translation unit.

In Example 3, the subject matter of Example 2 includes, wherein the condition is satisfied if the individual translation unit is storing host data.

In Example 4, the subject matter of Examples 2-3 includes, wherein the condition is satisfied if the individual translation unit is storing padding data.

In Example 5, the subject matter of Examples 1~4 includes, wherein the operations comprise: generating the block stripe data by collecting block stripe information from the source memory sub-system; and generating the P2L data by collecting P2L information from the source memory sub-system.

In Example 6, the subject matter of Example 5 includes, wherein the collecting of the block stripe information from the source memory sub-system comprises: retrieving the block stripe information from the source memory sub-system; determining a list of valid block stripes in the plurality of block stripes based on the retrieved block stripe information, each valid block stripe storing valid data; and generating the ordered list of valid block stripes by sorting the list of valid block stripes based on a respective block stripe version number of each valid block stripe in the list of valid block stripes.

In Example 7, the subject matter of Examples 5-6 includes, wherein the collecting of the P2L information from the source memory sub-system comprises: for an individual block stripe of the plurality of block stripes: retrieving, from the source memory sub-system, a memory address of each valid P2L drop within the individual block stripe; and based on the retrieved memory addresses, retrieving, from the source memory sub-system, data content of each valid P2L drop within the individual stripe, the data content of each valid P2L drop indicating a write sequence of translation units within at least a portion of the individual block stripe.

In Example 8, the subject matter of Examples 1-7 includes, wherein the operations comprise: prior to the sending of the sequence of write requests to the destination memory sub-system, causing the destination memory sub-system to be placed in an initial state by performing a low-level format of the destination memory sub-system.

In Example 9, the subject matter of Examples 1-8 includes, wherein the operations comprise: prior to the sending of the sequence of write requests to the destination memory sub-system, causing folding operations to be disabled on the destination memory sub-system.

In Example 10, the subject matter of Example 9 includes, wherein the operations comprise: after the sending of the sequence of write requests to the destination memory sub-system, causing folding operations to be enabled on the destination memory sub-system.

In Example 11, the subject matter of Examples 1-10 includes, wherein the operations comprise: prior to the sending of the sequence of write requests to the destination memory sub-system, causing translation layer writes to be disabled on the destination memory sub-system.

In Example 12, the subject matter of Example 11 includes, wherein the operations comprise: after the sending of the sequence of write requests to the destination memory sub-system, causing translation layer writes to be enabled on the destination memory sub-system.

In Example 13, the subject matter of Examples 1-12 includes, wherein the operations comprise: after the sending of the sequence of write requests to the destination memory sub-system, causing a snapshot of logical memory address-to-physical memory address (L2P) data to be generated on the destination memory sub-system.

Example 14 is at least one machine-readable medium comprising instructions that, when executed by a processing device, cause the processing device to perform operations to implement any of Examples 1-13

Example 15 is a method to implement any of Examples 1-13.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium (such as a non-transitory machine-readable medium) having stored thereon instructions, which can be used to program a computer system (or other electronic devices) to perform a process according to the present disclosure. A machine-readable medium includes any mechanism for storing information in a form readable by a machine (e.g., a computer). In some example embodiments, a machine-readable (e.g., computer-readable) medium includes a machine (e.g., a computer) readable storage medium such as a ROM, RAM, magnetic disk storage media, optical storage media, flash memory components, and so forth. A machine-readable storage medium can be non-transitory (in other words, not having any transitory signals) in that it does not embody a propagating signal. However, labeling a machine-readable storage medium "non-transitory" should not be construed to mean that the machine-readable storage medium is incapable of movement; the machine-readable storage medium should be considered as being transportable from one physical location to another.

In the foregoing specification, example embodiments of the disclosure have been described with reference to specific example embodiments thereof. It will be evident that various modifications can be made thereto without departing from the broader spirit and scope of example embodiments of the disclosure as set forth in the following claims. The specification and drawings are, accordingly, to be regarded in an illustrative sense rather than a restrictive sense.

The invention claimed is:

1. A system comprising:

a memory storing instructions; and a processing device operatively coupled to the memory, to a destination memory sub-system, and to a source memory sub-system that comprises one or more memory devices, the one or more memory devices comprising a plurality of block stripes storing data, the instructions causing the processing device to perform operations that comprise:

accessing block stripe data for the plurality of block stripes of the source memory sub-system, the block stripe data comprising an ordered list of valid block stripes that is ordered according to block stripe version numbers of valid block stripes;

accessing physical-to-logical (P2L) data for the plurality of block stripes of the source memory sub-system, the P2L data comprising a plurality of P2L data dumps of the plurality of block stripes, the plurality of P2L data dumps comprising a select P2L data dump associated with a select block stripe of the plurality of block stripes, the select P2L data dump describing a write sequence of translation units within the select block stripe; and sending a sequence of write requests to the destination memory sub-system, the sending of the sequence of write requests comprising generating the sequence of write requests from translation units of the source memory sub-system selected based on the ordered list of valid block stripes and the plurality of P2L data dumps.

2. The system of claim 1, wherein the generating of the sequence of write requests from translation units of the source memory sub-system selected based on the ordered list of valid block stripes and the plurality of P2L data dumps comprises:

determining, from the plurality of P2L data dumps, a set of P2L data dumps for the ordered list of valid block stripes;

generating an ordered set of P2L data dumps by sorting the set of P2L data dumps according to the ordered list of valid block stripes; and for each individual P2L data dump selected in order from the ordered set of P2L data dumps:

accessing the individual P2L data dump, the individual P2L data dump corresponding to an individual valid block stripe of the plurality of block stripes, the individual P2L data dump describing a write sequence of translation units within the individual block stripe; and for each individual translation unit selected in order from the write sequence of translation units within the individual block stripe:

determining whether the individual translation unit satisfies a condition to be written to the destination memory sub-system; and in response to determining that the individual translation unit satisfies the condition to be written to the destination memory sub-system, generating a write request for the destination memory sub-system based on the individual translation unit.

3. The system of claim 2, wherein the condition is satisfied if the individual translation unit is storing host data.

4. The system of claim 2, wherein the condition is satisfied if the individual translation unit is storing padding data.

5. The system of claim 1, wherein the operations comprise:

generating the block stripe data by collecting block stripe information from the source memory sub-system; and generating the P2L data by collecting P2L information from the source memory sub-system.

6. The system of claim 5, wherein the collecting of the block stripe information from the source memory sub-system comprises:

retrieving the block stripe information from the source memory sub-system;

determining a list of valid block stripes in the plurality of block stripes based on the retrieved block stripe information, each valid block stripe storing valid data; and generating the ordered list of valid block stripes by sorting the list of valid block stripes based on a respective block stripe version number of each valid block stripe in the list of valid block stripes.

7. The system of claim 5, wherein the collecting of the P2L information from the source memory sub-system comprises:

for an individual block stripe of the plurality of block stripes:

retrieving, from the source memory sub-system, a memory address of each valid P2L drop within the individual block stripe; and based on the retrieved memory addresses, retrieving, from the source memory sub-system, data content of each valid P2L drop within the individual stripe, the data content of each valid P2L drop indicating a write sequence of translation units within at least a portion of the individual block stripe.

8. The system of claim 1, wherein the operations comprise:

prior to the sending of the sequence of write requests to the destination memory sub-system, causing the destination memory sub-system to be placed in an initial state by performing a low-level format of the destination memory sub-system.

9. The system of claim 1, wherein the operations comprise:

prior to the sending of the sequence of write requests to the destination memory sub-system, causing folding operations to be disabled on the destination memory sub-system.

10. The system of claim 9, wherein the operations comprise:

after the sending of the sequence of write requests to the destination memory sub-system, causing folding operations to be enabled on the destination memory sub-system.

11. The system of claim 1, wherein the operations comprise:

prior to the sending of the sequence of write requests to the destination memory sub-system, causing translation layer writes to be disabled on the destination memory sub-system.

12. The system of claim 11, wherein the operations comprise:

after the sending of the sequence of write requests to the destination memory sub-system, causing translation layer writes to be enabled on the destination memory sub-system.

13. The system of claim 1, wherein the operations comprise:

after the sending of the sequence of write requests to the destination memory sub-system, causing a snapshot of logical memory address-to-physical memory address (L2P) data to be generated on the destination memory sub-system.

14. At least one non-transitory machine-readable storage medium comprising instructions that, when executed by a processing device of a host system, cause the processing device to perform operations comprising:

accessing block stripe data for a plurality of block stripes of one or more memory devices of a source memory sub-system operatively coupled to the host system, the plurality of block stripes storing data, the block stripe data comprising an ordered list of valid block stripes that is ordered according to block stripe version numbers of valid block stripes;

accessing physical-to-logical (P2L) data for the plurality of block stripes of the source memory sub-system, the P2L data comprising a plurality of P2L data dumps of the plurality of block stripes, the plurality of P2L data dumps comprising a select P2L data dump associated with a select block stripe of the plurality of block stripes, the select P2L data dump describing a write sequence of translation units within the select block stripe; and sending a sequence of write requests to a destination memory sub-system operatively coupled to the host system, the sending of the sequence of write requests comprising generating the sequence of write requests from translation units of the source memory sub-system selected based on the ordered list of valid block stripes and the plurality of P2L data dumps.

15. The at least one non-transitory machine-readable storage medium of claim 14, wherein the generating of the sequence of write requests from translation units of the source memory sub-system selected based on the ordered list of valid block stripes and the plurality of P2L data dumps comprises:

determining, from the plurality of P2L data dumps, a set of P2L data dumps for the ordered list of valid block stripes;

generating an ordered set of P2L data dumps by sorting the set of P2L data dumps according to the ordered list of valid block stripes; and for each individual P2L data dump selected in order from the ordered set of P2L data dumps:

accessing the individual P2L data dump, the individual P2L data dump corresponding to an individual valid block stripe of the plurality of block stripes, the individual P2L data dump describing a write sequence of translation units within the individual block stripe; and for each individual translation unit selected in order from the write sequence of translation units within the individual block stripe:

determining whether the individual translation unit satisfies a condition to be written to the destination memory sub-system; and in response to determining that the individual translation unit satisfies the condition to be written to the destination memory sub-system, generating a write request for the destination memory sub-system based on the individual translation unit.

16. The at least one non-transitory machine-readable storage medium of claim 15, wherein the condition is satisfied if the individual translation unit is storing padding data.

17. The at least one non-transitory machine-readable storage medium of claim 15, wherein the condition is satisfied if the individual translation unit is storing padding data.

18. The at least one non-transitory machine-readable storage medium of claim 14, wherein the operations comprise:

generating the block stripe data by collecting block stripe information from the source memory sub-system; and generating the P2L data by collecting P2L information from the source memory sub-system.

19. The at least one non-transitory machine-readable storage medium of claim 14, wherein the operations comprise:

prior to the sending of the sequence of write requests to the destination memory sub-system:

causing the destination memory sub-system to be placed in an initial state by performing a low-level format of the destination memory sub-system;

causing folding operations to be disabled on the destination memory sub-system; and causing translation layer writes to be disabled on the destination memory sub-system.

20. A method comprising:

accessing, by a processing device of a host system, block stripe data for a plurality of block stripes of one or more memory devices of a source memory sub-system operatively coupled to the host system, the plurality of block stripes storing data, the block stripe data comprising an ordered list of valid block stripes that is ordered according to block stripe version numbers of valid block stripes;

accessing, by the processing device, physical-to-logical (P2L) data for the plurality of block stripes of the source memory sub-system, the P2L data comprising a plurality of P2L data dumps of the plurality of block stripes, the plurality of P2L data dumps comprising a select P2L data dump associated with a select block stripe of the plurality of block stripes, the select P2L data dump describing a write sequence of translation units within the select block stripe; and sending, by the processing device, a sequence of write requests to a destination memory sub-system operatively coupled to the host system, the sending of the sequence of write requests comprising generating the sequence of write requests from translation units of the source memory sub-system selected based on the ordered list of valid block stripes and the plurality of P2L data dumps.

* * * * *